(12) United States Patent
Chiu et al.

(10) Patent No.: US 8,503,173 B2
(45) Date of Patent: Aug. 6, 2013

(54) COMPUTER SYSTEM WITH AIR GUIDING DUCT

(75) Inventors: Po-Wen Chiu, New Taipei (TW); Wen-Hu Lu, Shenzhen (CN); Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/225,674

(22) Filed: Sep. 6, 2011

(65) Prior Publication Data

US 2012/0162907 A1 Jun. 28, 2012

(30) Foreign Application Priority Data

Dec. 28, 2010 (CN) .......................... 2010 1 0609774

(51) Int. Cl.
*H05K 7/20* (2006.01)

(52) U.S. Cl.
USPC ............ 361/679.54; 361/679.47; 361/679.48; 361/679.49; 361/690; 361/695; 361/697; 165/80.3; 165/104.34; 165/121; 165/122; 165/185

(58) Field of Classification Search
USPC ....... 361/679.46–679.55, 690–697, 704–712, 361/715, 719–724, 727; 165/80.2–80.5, 104.33, 165/104.34, 121–126, 185; 174/15.1, 16.3, 174/252; 454/184; 24/295, 297, 453, 457, 24/627; 257/706–727; 248/316.7, 505–510
See application file for complete search history.

(56) References Cited

U.S. PATENT DOCUMENTS

| | | | | |
|---|---|---|---|---|
| 5,910,884 A * | 6/1999 | Garza et al. | ................... | 361/690 |
| 7,272,009 B2 * | 9/2007 | Sura et al. | ..................... | 361/719 |
| 7,359,192 B2 * | 4/2008 | Yang et al. | .................... | 361/695 |
| 7,586,746 B2 * | 9/2009 | Liu | ................................ | 361/695 |
| 7,746,632 B2 * | 6/2010 | Song et al. | ............... | 361/679.49 |
| 8,047,271 B2 * | 11/2011 | Chen et al. | .................... | 165/121 |
| 8,069,908 B2 * | 12/2011 | Chen et al. | .................. | 165/80.3 |
| 8,363,401 B2 * | 1/2013 | Lai | ................................ | 361/697 |

* cited by examiner

*Primary Examiner* — Michail V Datskovskiy
(74) *Attorney, Agent, or Firm* — Altis Law Group, Inc.

(57) ABSTRACT

A computer system includes a computer case and an air guiding duct. The motherboard is attached to the computer case, and a heat sink is attached to the motherboard. The air guiding duct includes a top panel. A mounting member is slidably attached to the top panel and is clipped to the heat sink. A limiting device is located on the top panel and engaged with the mounting member to prevent the mounting member from sliding relative the top panel.

20 Claims, 5 Drawing Sheets

COMPUTER SYSTEM WITH AIR GUIDING DUCT

BACKGROUND

1. Technical Field

The present disclosure relates to computer systems, more particularly to a computer system with an air guiding duct.

2. Description of Related Art

Heat dissipating devices perform the critical function of removing heat from a computer system. For example, a heat sink is provided to efficiently dissipate heat generated by a CPU, and an air guiding duct is provided to direct air out of the computer system. Usually, the air guiding duct is attached to the heat sink by a plurality of screws, which makes assembly and disassembly time-consuming and inconvenient.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
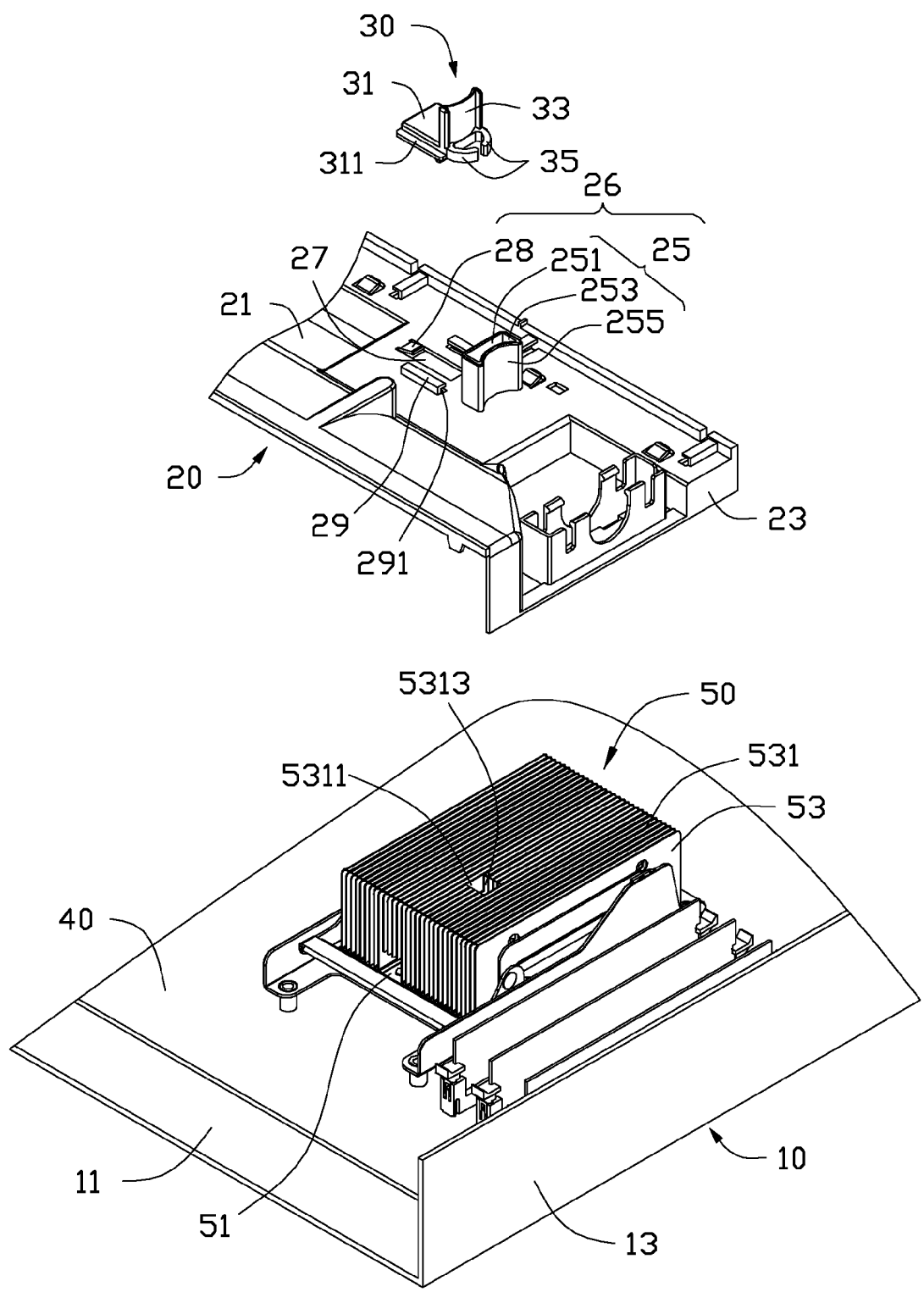
FIG. 1 is an exploded, cut view of a computer system in accordance with an embodiment.
Figure 2:
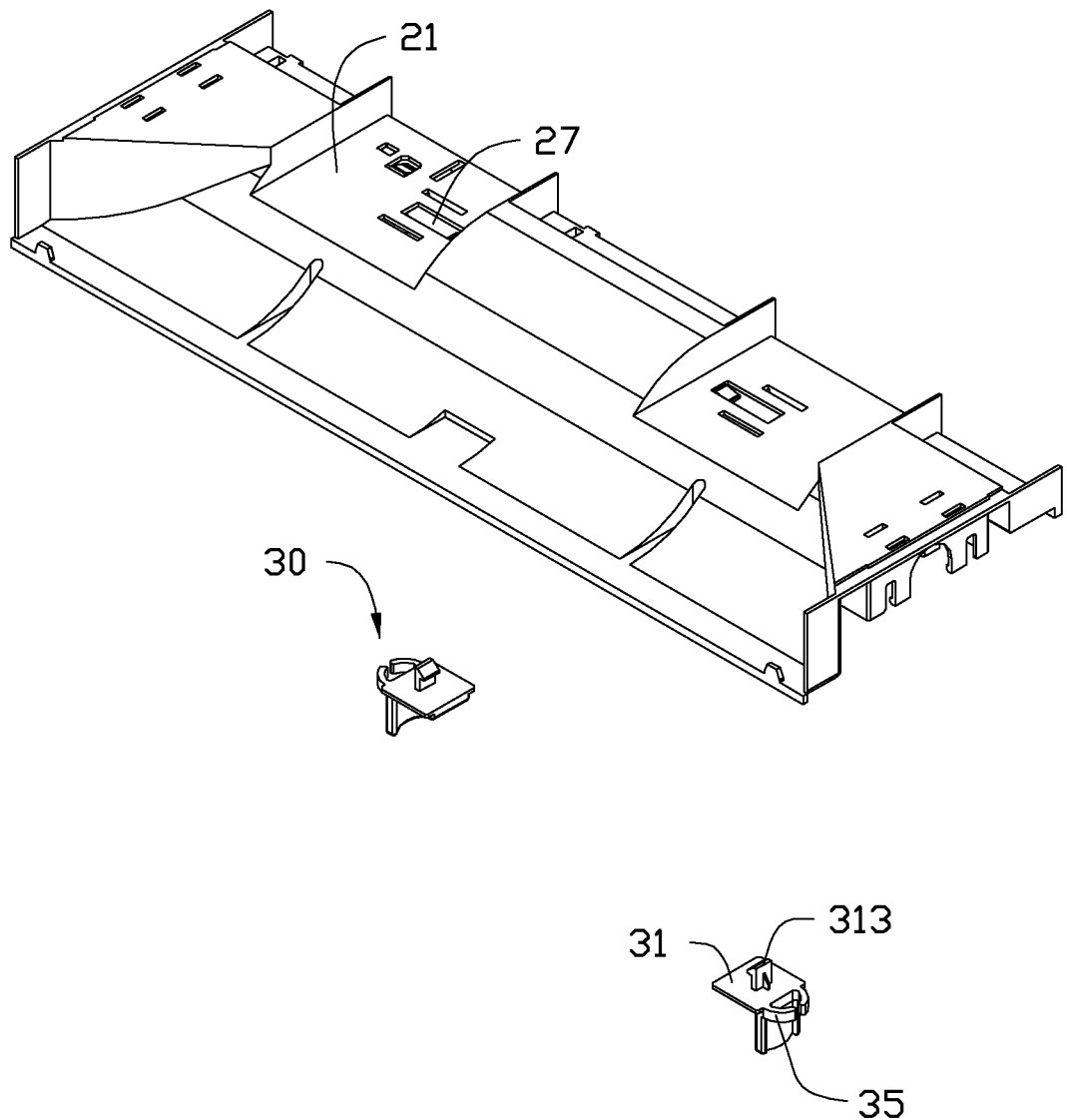
FIG. 2 is an exploded, isometric view of an air guiding duct and two mounting members of the computer system in accordance with an embodiment.

Referring to FIGS. 1 and 2, a computer system in accordance with an embodiment includes a computer case 10, an air guiding duct 20, two mounting members 30 securing the air guiding duct 20 to the computer case 10. In one embodiment, the computer system can be a server.

The computer case 10 can have various configurations, such as different wall or base configurations as long as the computer case 10 can couple with a cover (not shown) to create a receiving space housing electronic components. The computer case 10 includes a bottom plate 11, and a side plate 13 connected to the bottom plate 11. In one embodiment, the side plate 13 is substantially perpendicular to the bottom plate 11.

A motherboard 40 is attached to the bottom plate 11. The motherboard 40 can also include various components that are typical of a computing device. For example, a chip (not shown) and a heat sink 50 are located on the motherboard 40. The heat sink 50 includes a base 51 and a plurality of fins 53 arranged on the base 51. A flange 531 extends from a top edge of each fin 53 in a same direction. In one embodiment, a width of the flange 531 is substantially equal to a gap between every two adjacent fins 53, to cover the gap. The plurality of fins 53 defines a receiving slot 5313. In one embodiment, a cutout 5311 may be defined in each of at least two fins 53, so the at least two cutouts 5311 cooperatively define the receiving slot 5313.

The air guiding duct 20 includes a top panel 21 and two side panels 23 connected two opposite sides of the top panel 21. The top panel 21 defines two limiting devices 26. Each limiting device 26 includes a stopping member 25 extending upward from the top panel 21, and a resisting member 28 extending towards to the stopping member 25. The stopping member 25 includes a rectangle panel 251, two side panels 253 connected to the rectangle panel 251, and an arcuate panel 255 pointing at the rectangle panel 251.

An opening 27 is defined in the top panel 21 adjacent to the stopper member 25. In one embodiment, the resisting member 28 is slanted relative to the top panel 21, located on an edge of the opening 27 and opposite to the stopper member 25. Two sliding portions 29, each with a sliding slot 291, are located on opposite sides of the opening 27. In one embodiment, each sliding portion 29 is L-shaped.

Each mounting member 30 includes a bottom panel 31, an operating portion 33 located on the bottom panel 31, and two resilient arms 35 extending from a first end of the bottom panel 31. The bottom panel 31 defines two sliding edges 311. A clasping portion (hook 313) is located on a bottom surface of the bottom panel 31. An extending direction of a first one of the two resilient arms 35 is opposite to that of a second one of the two resilient arms 35. A radian of the first one of the two resilient arms 35 is same as that of the second one of the two resilient arms 35. In one embodiment, the operating portion 33 is arcuate, and each resilient arm 35 is arcuate.

Figure 3:
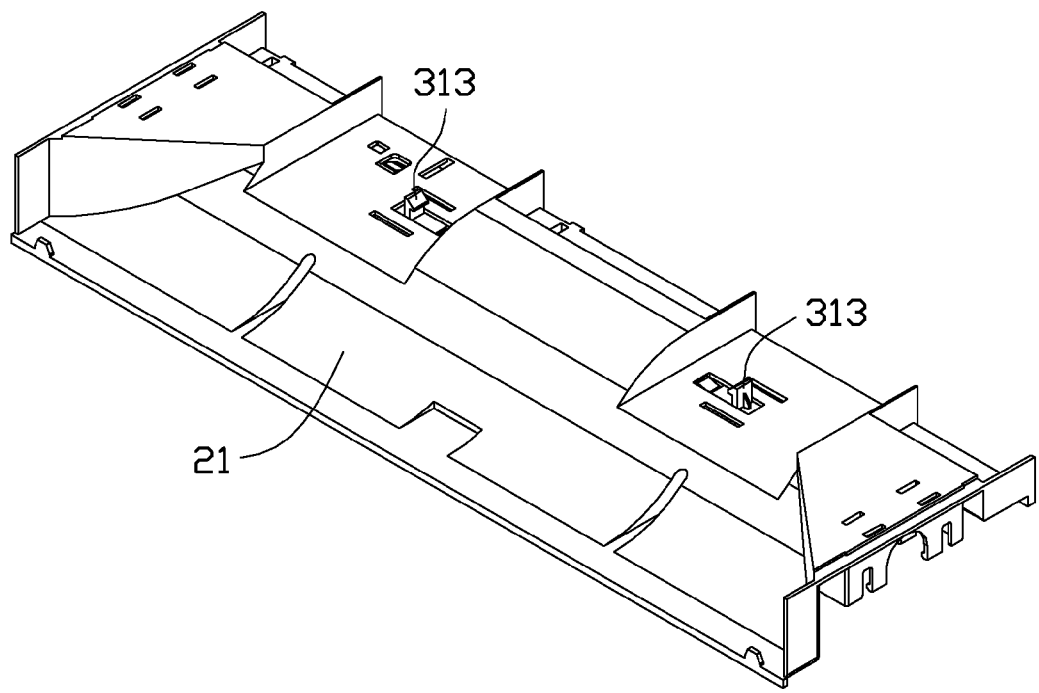
FIG. 3 is an assembled view of FIG. 2.
Figure 4:
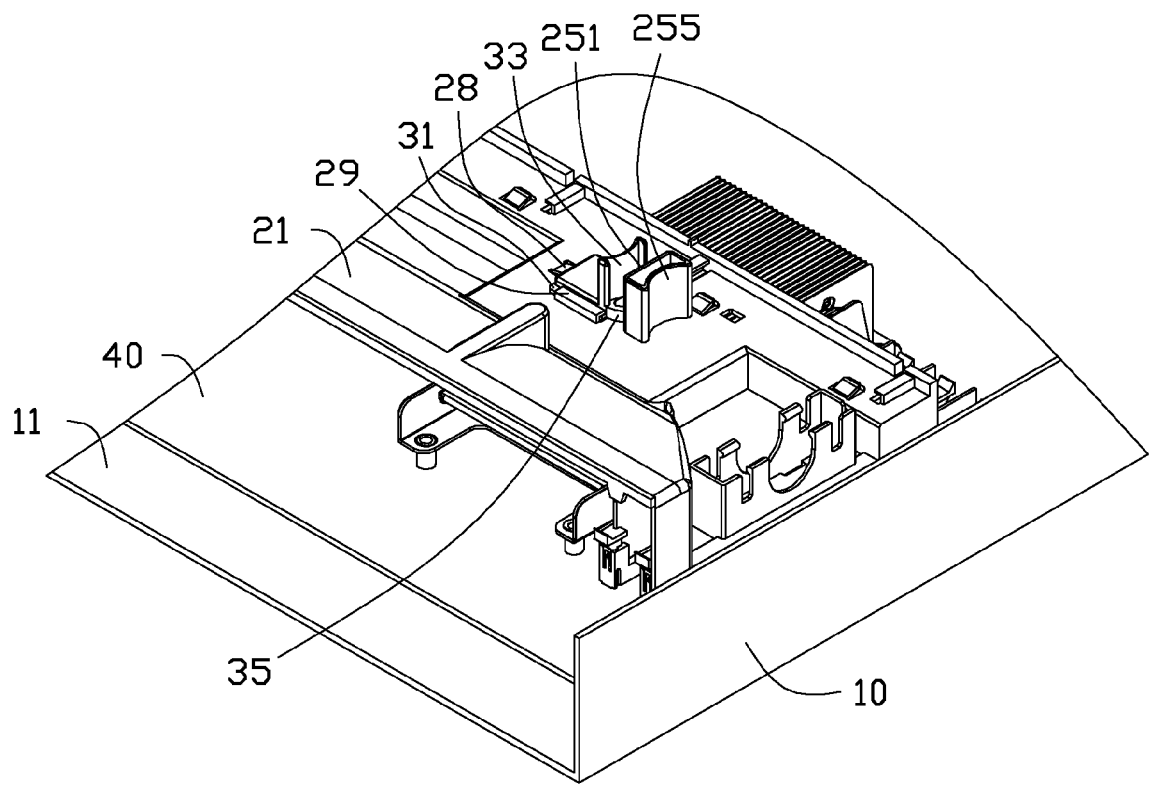
FIG. 4 is an assembled view of FIG. 1.
Figure 5:
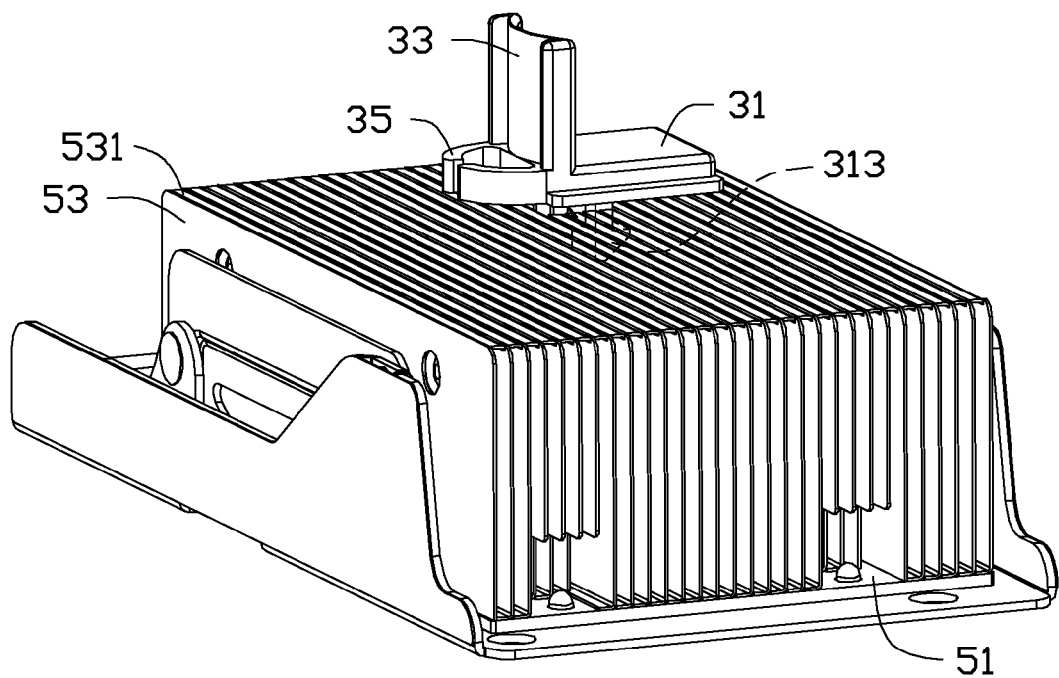
FIG. 5 is an assembled view of a heat sink and a mounting member of the computer system in accordance with an embodiment.

Referring to FIGS. 3-5, in assembly, each mounting member 30 is located on the air guiding duct 20, and the resilient arm 35 is towards to the stopping member 25. The two sliding edges 311 are towards to the two sliding slots 291 and adjacent to the resisting member 28. The hook 313 extends through the opening 28, and the bottom panel 31 abuts the resisting member 28. The mounting member 30 is pushed towards the stopping member 25 in a first direction substantially parallel to the top panel 21, to slide the sliding edges 311 into the sliding slots 291. The hook 313 slides in the opening 27, until the resilient arms 35 abut the stopping member 25, and a second end of the bottom panel 31 abuts the resisting member 28. Therefore, the mounting member 30 can be slidably located between the resisting member 28 and the stopping member 25, and positioned relative to the air guiding duct 20 between a first position and a second position. In the first position, the second end of the bottom panel 31 abuts the resisting member 28. In the second position, the resilient arms 35 are deformed and abut the rectangle panel 251.

The air guiding duct 20 is located on the heat sink 50, and the hook 313 abuts on the flange 531 and adjacent to the receiving slot 5313. The arcuate panel 255 and the operating panel 33 are operated to move the mounting member 30 in the first direction, and the hook 313 is slid in the opening 27, and the two resilient arms 35 are deformed in opposite directions, until the mounting member 30 is located in the second position, and the hook 313 is slid into the receiving slot 5313. The arcuate panel 255 and the operating panel 33 are released, the mounting member 30 is slid to the first position from the second position, and the resilient arms 35 are released. Thus, the hook 313 can be engaged with the flanges 531.

In disassembly, the arcuate panel 255 and the operating panel 33 are operated. The mounting member 30 is moved in the first direction, and the hook 313 is disengaged from the flange 531. The air guiding duct 20 is moved upward, to clear the hook 313 from the receiving slot 5313. Therefore, the air guiding duct 20 can be disengaged from the computer case 10.

In other embodiments, an elastic component, such as a compression spring, or an extension spring, is mounted between the mounting member 30 and the stopping member 25, without the resilient arms 35.

It is to be understood, however, that even though numerous characteristics and advantages have been set forth in the foregoing description of exemplary embodiments, together with details of the structures and functions of the exemplary embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A computer system comprising:
    a computer case;
    a motherboard attached to the computer case;
    a heat sink attached to the motherboard;
    an air guiding duct comprising a top panel and a mounting member slidably attached to the top panel; and
    a limiting device located on the top panel;
    wherein the heat sink is latched by the mounting member to retain the air guiding duct to the heat sink, and the limiting device is engaged with the mounting member to prevent the mounting member from moving relative to the top panel.

2. The computer system of claim 1, wherein the limiting device comprises a resisting member and a stopping member, and the mounting member is slidably located between the resisting member and the stopping member.

3. The computer system of claim 2, wherein an opening is defined in the top panel, and the resisting member is located at an edge of the opening and slanted relative to the top panel.

4. The computer system of claim 3, wherein the mounting member comprises a bottom panel and a clasping portion extending from a bottom surface of the bottom panel, and the clasping portion extends through the opening.

5. The computer system of claim 4, wherein the heat sink comprise a plurality of fins, each of the plurality of fins comprising a main body and a flange extending from an edge of the main body, at least two fins of the plurality of fins defines a receiving slot, and the clasping portion is received in the receiving slot and engaged with the flange.

6. The computer system of claim 4, wherein the mounting member further comprises a first resilient arm and a second resilient arm extending from the bottom panel, an extending direction of the first resilient arm is opposite to that of the second resilient arm, and the first resilient arm and the second resilient arm are deformed in opposite directions when the mounting member is slid relative to the top panel.

7. The computer system of claim 4, wherein the mounting member further comprises an operating panel, and the operating panel is arcuate and substantially perpendicular to the bottom panel.

8. The computer system of claim 4, wherein a sliding portion is located between the resisting member and the stopping member, and the bottom panel comprises a sliding edge slidably engaged with the sliding portion.

9. The computer system of claim 8, wherein the sliding portion is L-shaped and defines a sliding slot, and the sliding edge is received in the sliding slot.

10. A computer system comprising:
    a computer case;
    a motherboard attached to the computer case;
    a heat sink attached to the motherboard;
    an air guiding duct comprising a top panel, the top panel defining an opening;
    a limiting device located on the top panel, comprising a resisting member and a stopping member, the opening located between the resisting member and the stopping member; and
    a mounting member slidably located between the resisting member and the stopping member, wherein the mounting member comprises a clasping portion extending through the opening and latched to the heat sink, and the mounting member is slidable relative to the top panel to disengage the clasping portion from the heat sink.

11. The computer system of claim 10, wherein the resisting member is located at an edge of the opening and slanted relative to the top panel.

12. The computer system of claim 11, wherein the heat sink comprises a plurality of fins, each of the plurality of fins comprising a main body and a flange extending from an edge of the main body, at least two fins of the plurality of fins defines a receiving slot, and the clasping portion is received in the receiving slot and engaged with the flange.

13. The computer system of claim 10, wherein the mounting member comprises a bottom panel, and the clasping portion extends from a bottom surface of the bottom panel.

14. The computer system of claim 13, wherein the clasping portion is substantially perpendicular to the bottom panel.

15. The computer system of claim 13, wherein a sliding portion is located between the resisting member and the stopping member, and the bottom panel comprises a sliding edge slidably engaged with the sliding portion.

16. The computer system of claim 15, wherein the sliding portion is L-shaped and defines a sliding slot, and the sliding edge is received in the sliding slot.

17. The computer system of claim 13, wherein the mounting member further comprises an operating panel, and the operating panel is arcuate and substantially perpendicular to the bottom panel.

18. The computer system of claim 13, wherein the mounting member further comprises a first resilient arm and a second resilient arm extending from the bottom panel, an extending direction of the first resilient arm is opposite to that of the second resilient arm, and the first resilient arm and the second resilient arm are deformed in opposite directions when the mounting member is slid relative to the top panel.

19. The computer system of claim 18, wherein the resilient arm is an extension spring.

20. The computer system of claim 18, wherein the resilient arm is a compression spring.

\* \* \* \* \*